(12) United States Patent
Ching et al.

(10) Patent No.: US 10,115,788 B2
(45) Date of Patent: Oct. 30, 2018

(54) SEMICONDUCTOR DEVICES WITH HORIZONTAL GATE ALL AROUND STRUCTURE AND METHODS OF FORMING THE SAME

(71) Applicant: Taiwan Semiconductor Manufacturing Company Limited, Hsinchu (TW)

(72) Inventors: Kuo-Cheng Ching, Hsinchu County (TW); Guan-Lin Chen, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/512,963

(22) Filed: Oct. 13, 2014

(65) Prior Publication Data

US 2016/0104765 A1    Apr. 14, 2016

(51) Int. Cl.
*H01L 29/06* (2006.01)
*H01L 21/8234* (2006.01)
(Continued)

(52) U.S. Cl.
CPC .... *H01L 29/0615* (2013.01); *H01L 21/76224* (2013.01); *H01L 21/823418* (2013.01); *H01L 21/823431* (2013.01); *H01L 21/823481* (2013.01); *H01L 29/0673* (2013.01); *H01L 29/1054* (2013.01); *H01L 29/167* (2013.01); *H01L 29/267* (2013.01); *H01L 29/42392* (2013.01); *H01L 29/66795* (2013.01); *H01L 29/785* (2013.01)

(58) Field of Classification Search
CPC ............ H01L 29/41791; H01L 29/785; H01L 29/7848; H01L 29/518; H01L 29/4958; H01L 29/49; H01L 29/165; H01L 29/7858; H01L 21/823807; H01L 21/823814; H01L 21/82331; H01L 21/82341; H01L 21/76224; H01L 21/28525; H01L 21/28568
See application file for complete search history.

(56) References Cited

U.S. PATENT DOCUMENTS 6,117,717 A * 9/2000 Carbone ............. H01L 21/8249
  257/370
8,497,171 B1 * 7/2013 Wu ................... H01L 21/82382
  438/199
(Continued)

FOREIGN PATENT DOCUMENTS

WO    WO2013/022753    * 2/2013
WO    WO 2013/095651   * 6/2013
WO    WO 2013/101004   * 7/2013

*Primary Examiner* — Dale E Page
*Assistant Examiner* — Quovaunda V Jefferson
(74) *Attorney, Agent, or Firm* — Jones Day

(57) ABSTRACT

A semiconductor device having a horizontal gate all around structure is provided. The semiconductor device includes a substrate and a fin. The fin is disposed on the substrate, and includes an anti-punch through (APT) layer formed of a material at a dose of about 1E18 atoms/cm$^2$ to about 1E19 atoms/cm$^2$, and a barrier layer formed above the APT layer. A method of forming a semiconductor device having a horizontal gate all around structure is also provided.

20 Claims, 17 Drawing Sheets

(51) Int. Cl.
*H01L 21/762* (2006.01)
*H01L 29/267* (2006.01)
*H01L 29/10* (2006.01)
*H01L 29/167* (2006.01)
*H01L 29/423* (2006.01)
*H01L 29/66* (2006.01)
*H01L 29/78* (2006.01)

(56) References Cited

U.S. PATENT DOCUMENTS

| | | | | |
|---|---|---|---|---|
| 2003/0102490 | A1* | 6/2003 | Kubo | H01L 21/28185 |
| | | | | 257/192 |
| 2007/0148857 | A1* | 6/2007 | Ban | H01L 21/84 |
| | | | | 438/243 |
| 2011/0117679 | A1* | 5/2011 | Lee | H01L 29/41791 |
| | | | | 438/5 |
| 2013/0105914 | A1* | 5/2013 | Lin | H01L 29/7851 |
| | | | | 257/402 |
| 2015/0318377 | A1* | 11/2015 | Cheng | H01L 29/0638 |
| | | | | 257/349 |

* cited by examiner

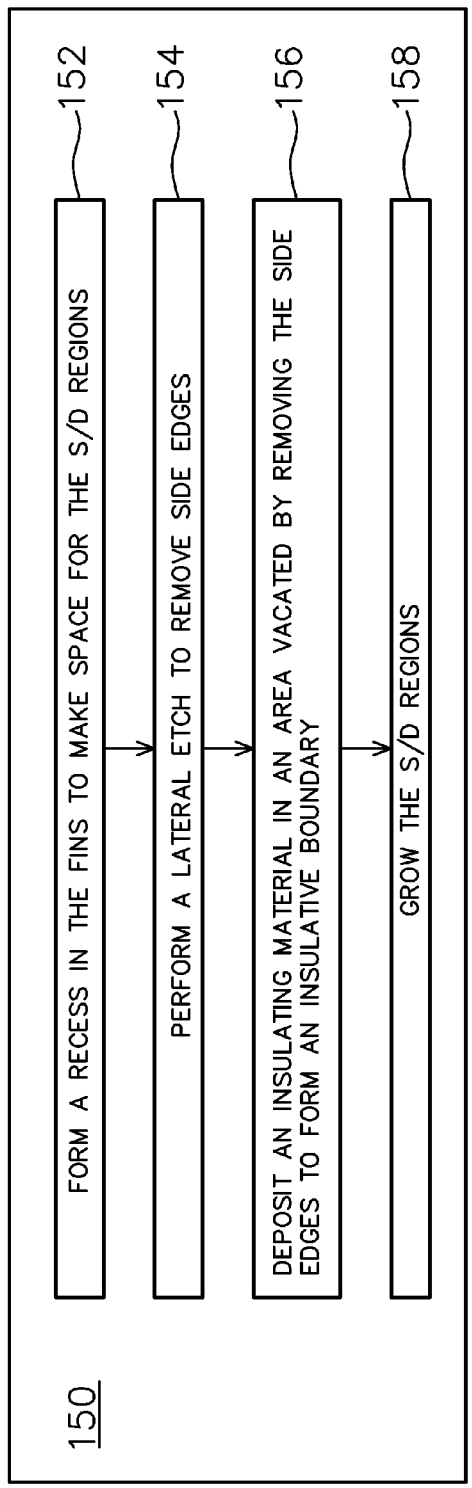
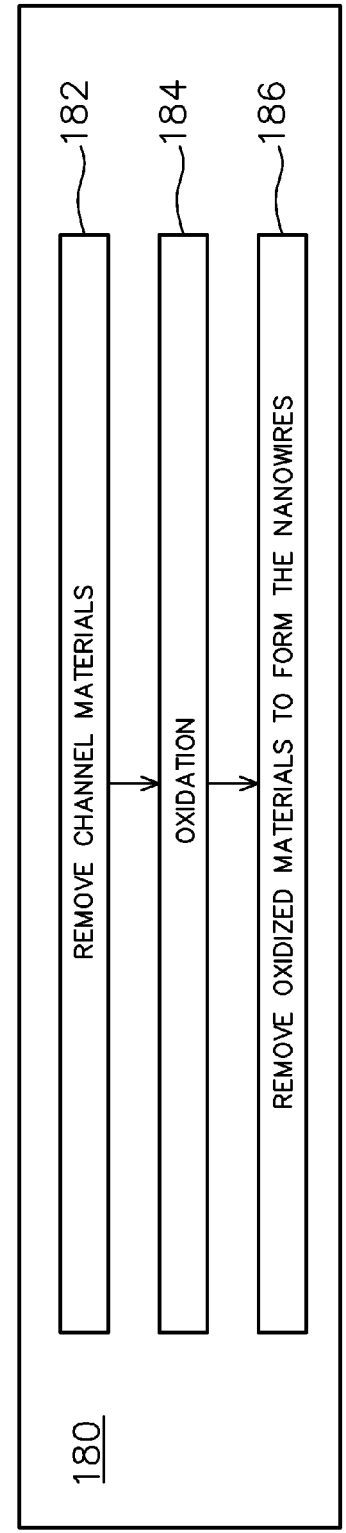
Fig.1C
Fig.1D

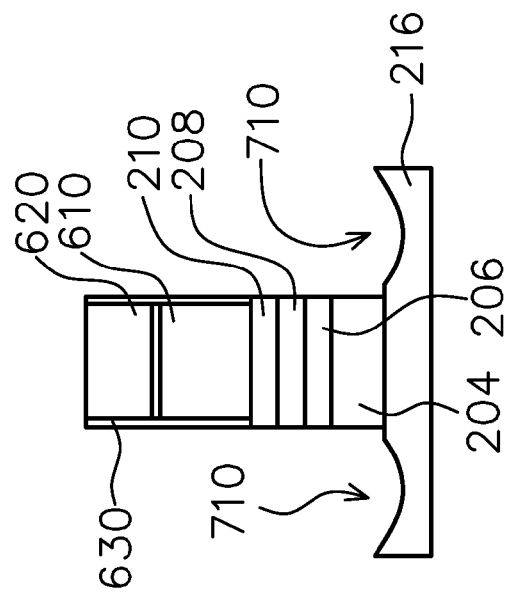
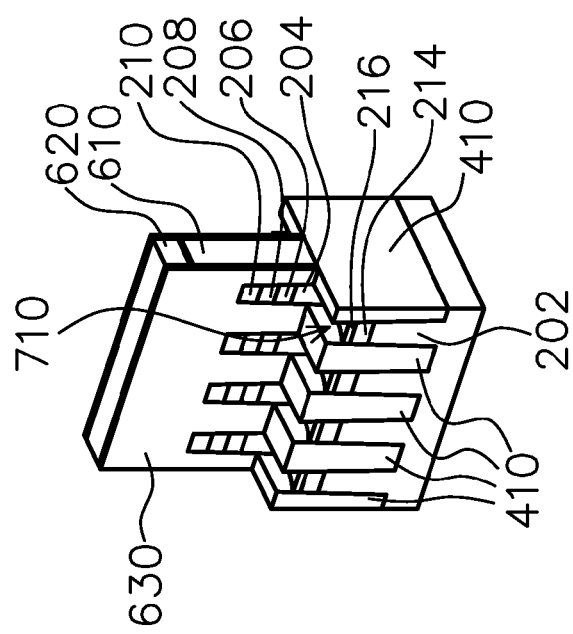
Fig. 7A
Fig. 7B

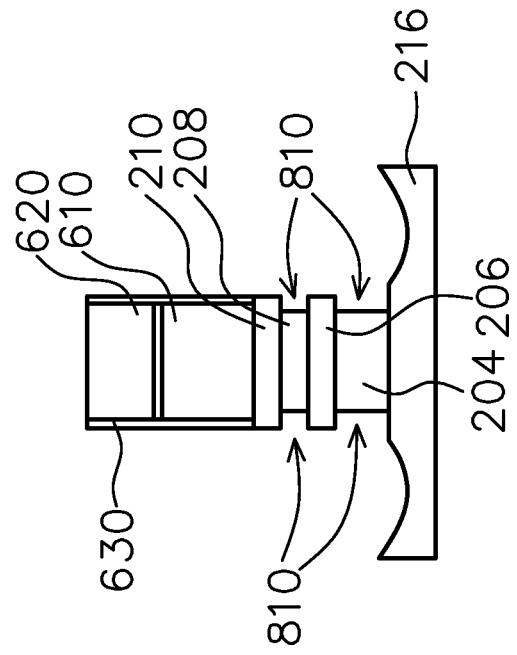
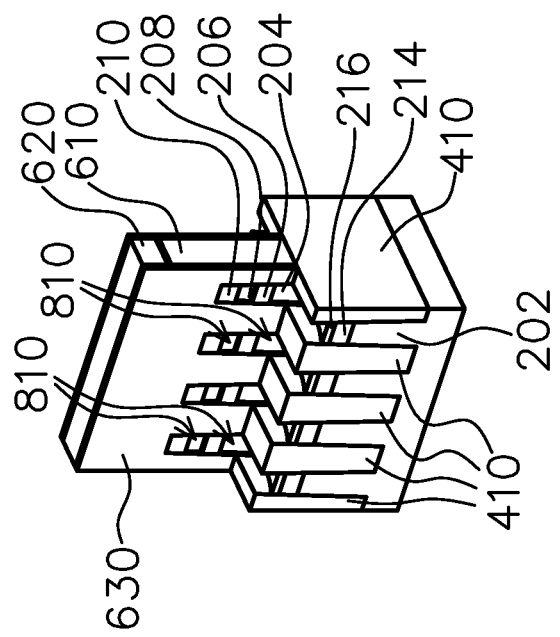
Fig.8A
Fig.8B

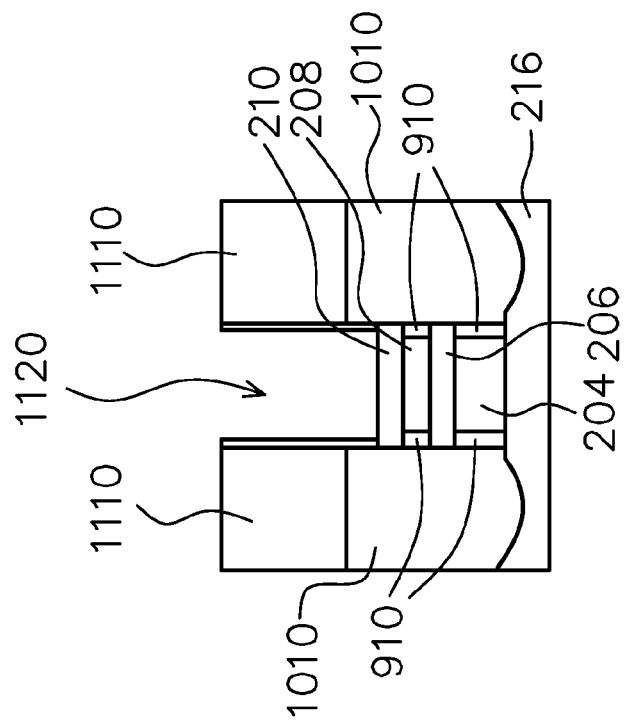
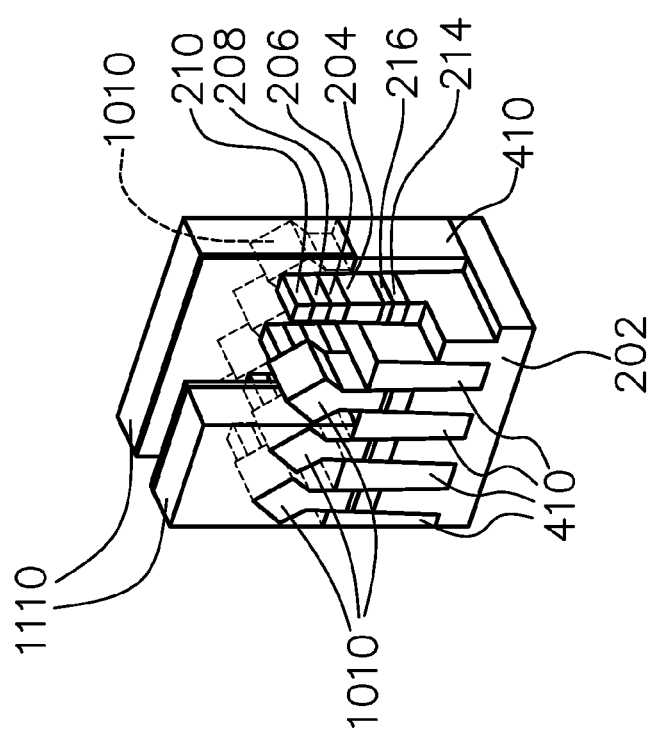

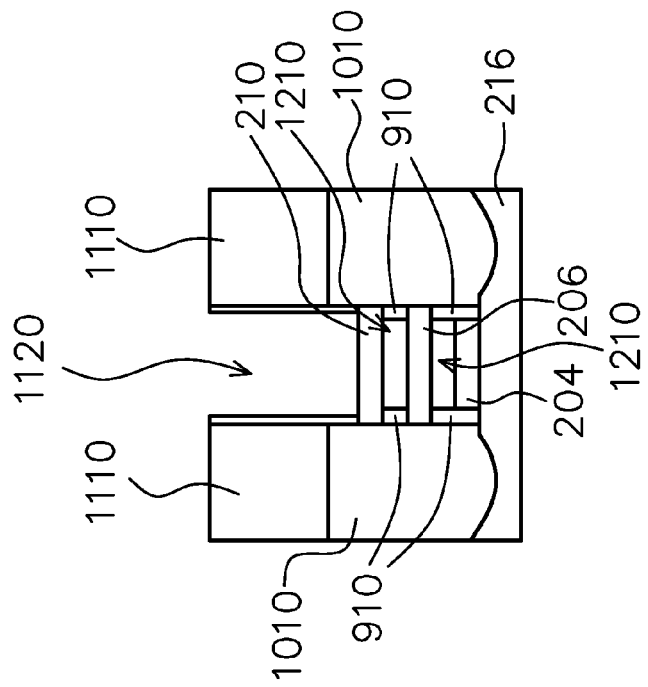
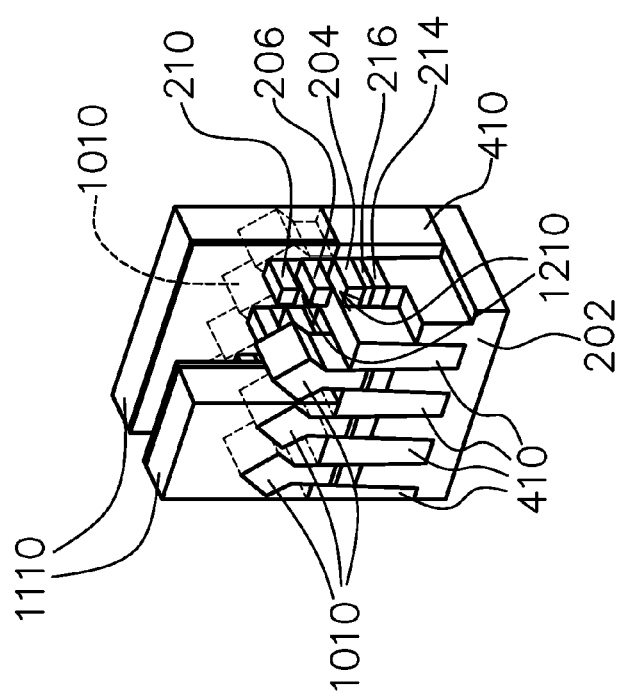
Fig.12A
Fig.12B

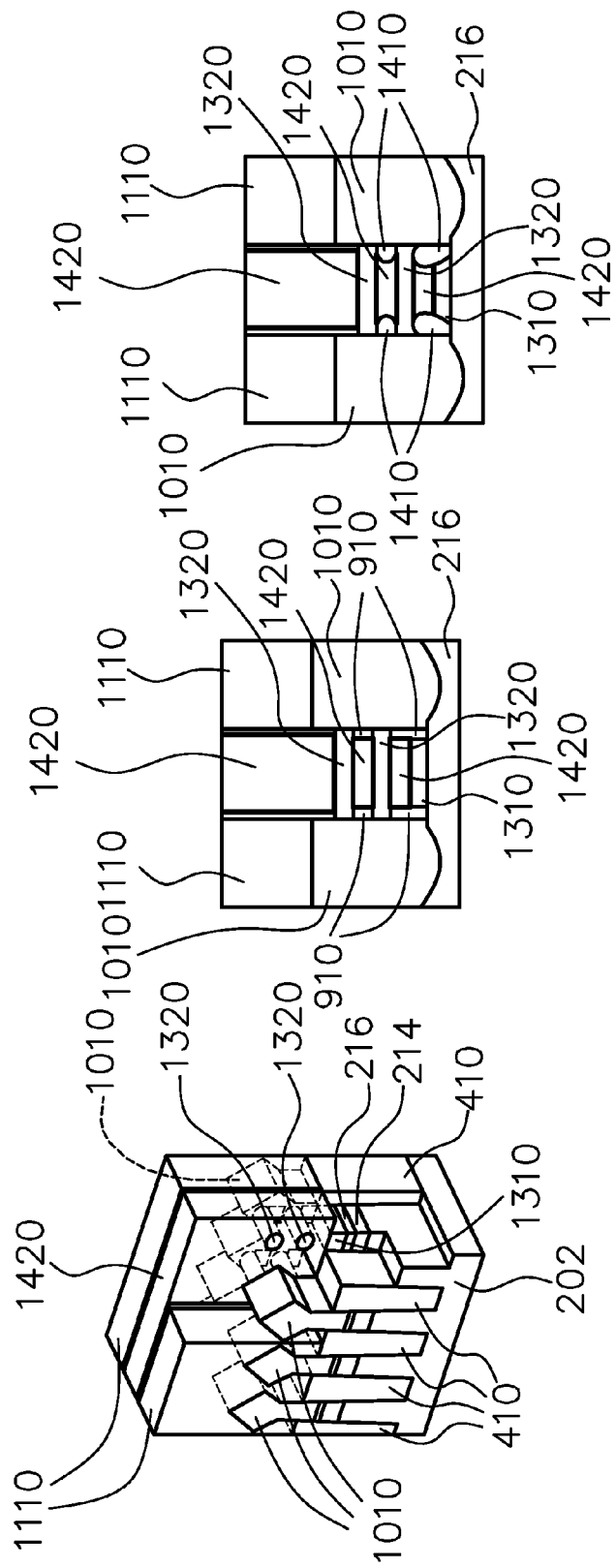

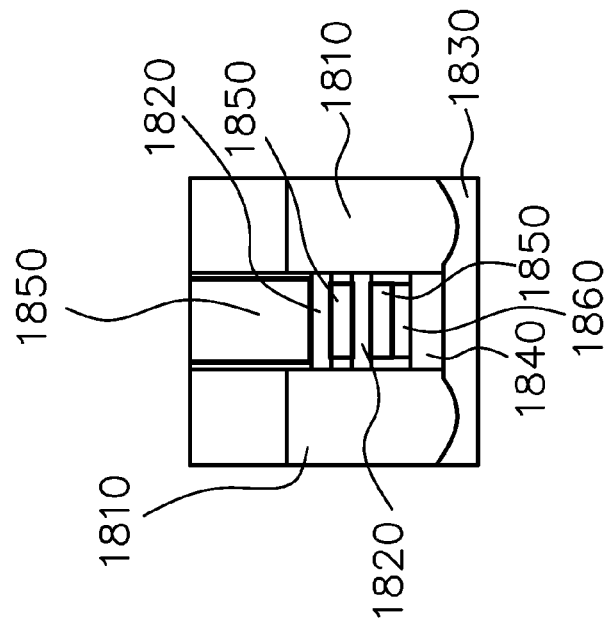
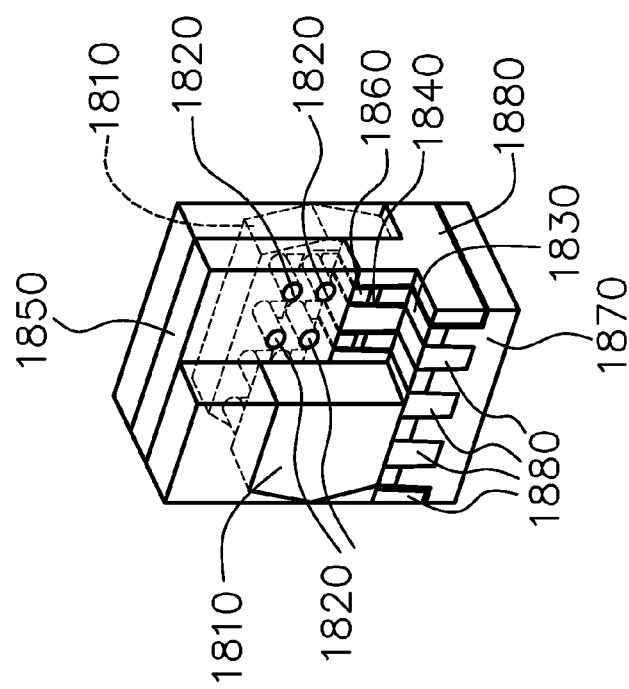
Fig.18B
Fig.18A

SEMICONDUCTOR DEVICES WITH HORIZONTAL GATE ALL AROUND STRUCTURE AND METHODS OF FORMING THE SAME

CROSS-REFERENCE TO A RELATED APPLICATION

The present application is a continuation-in-part of U.S. patent application Ser. No. 14/317,069, filed on Jun. 27, 2014, entitled "METHOD OF FORMING SEMICONDUCTOR STRUCTURE WITH HORIZONTAL GATE ALL AROUND STRUCTURE," which is hereby incorporated into the present application by reference.

BACKGROUND

The technology described in this patent document relates generally to semiconductor devices and more particularly to a semiconductor device with a horizontal gate all around structure.

Scaling of semiconductor devices, such as a metal-oxide semiconductor field-effect transistor (MOSFET), has enabled continued improvement in speed, performance, density, and cost per unit function of integrated circuits over the past few decades. Development of improved fabrication techniques can further the scaling of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1C is a process flow chart of another operation of FIG. 1 in accordance with some embodiments.

FIG. 1D is a process flow chart of another operation of FIG. 1 in accordance with some embodiments.

FIG. 7A is a block diagram of an example semiconductor structure at another stage during fabrication of a semiconductor device having a horizontal gate all around structure in accordance with some embodiments.

FIG. 7B represents a cross sectional view of a portion of the semiconductor structure of FIG. 7A in accordance with some embodiments.

FIG. 8A is a block diagram of an example semiconductor structure at another stage during fabrication of a semiconductor device having a horizontal gate all around structure in accordance with some embodiments.

FIG. 8B represents a cross sectional view of a portion of the semiconductor structure of FIG. 8A in accordance with some embodiments.

FIG. 11A is a block diagram of an example semiconductor structure at another stage during fabrication of a semiconductor device having a horizontal gate all around structure in accordance with some embodiments.

FIG. 11B represents a cross sectional view of a portion of the semiconductor structure of FIG. 11A in accordance with some embodiments.

FIG. 12A is a block diagram of an example semiconductor structure at another stage during fabrication of a semiconductor device having a horizontal gate all around structure in accordance with some embodiments.

FIG. 12B represents a cross sectional view of a portion of the semiconductor structure of FIG. 12A in accordance with some embodiments.

FIG. 14A is a block diagram of an example semiconductor structure at another stage during fabrication of a semiconductor device having a horizontal gate all around structure in accordance with some embodiments.

FIG. 14B represents a cross sectional view of a portion of the semiconductor structure of FIG. 14A in accordance with some embodiments.

FIG. 14C represents a cross sectional view of another portion of the semiconductor structure of FIG. 14A in accordance with some embodiments.

FIG. 18A is a block diagram of an example semiconductor structure at one stage during fabrication of a semiconductor device having a horizontal gate all around structure in accordance with some embodiments.

FIG. 18B represents a cross sectional view of a portion of the semiconductor structure of FIG. 18A in accordance with some embodiments.

DETAILED DESCRIPTION

Figure 1:
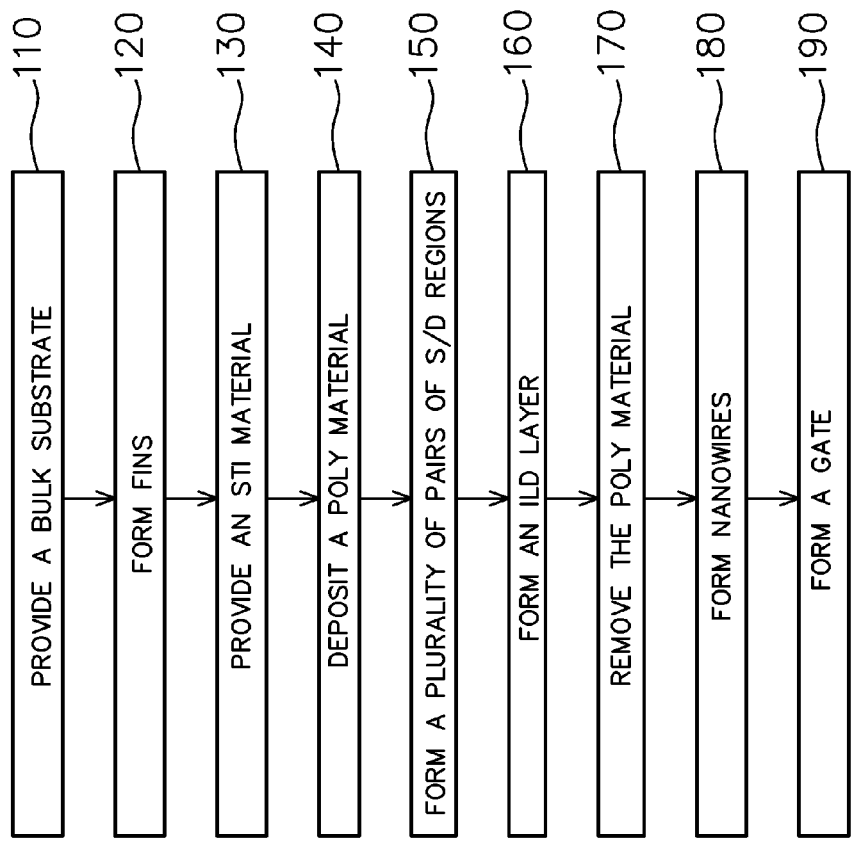
FIG. 1 is a process flow chart illustrating an example method of forming a semiconductor device having a horizontal gate all around structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides an example semiconductor device that includes a substrate and a plurality of fins. The fins are formed on the substrate, and include a high dose of anti-punch through (APT) layer, and one or more channel layers formed above the APT layer. The APT layer prevents punch through between source and drain regions of the semiconductor device. The present disclosure also provides an example method of fabricating a semiconductor device, in which an APT layer of the semiconductor device is formed prior to formation of one or more channel layers of the semiconductor device.

FIG. 1 is a process flow chart illustrating an example method of forming a semiconductor device having a horizontal gate all around structure. The method begins with the provision of a bulk substrate (operation 110). A plurality of fins are then formed on the bulk substrate (operation 120). Each fin comprises a vertical slice of substrate material, a slice of anti-punch through (APT) layer in the vertical slice of substrate material, a slice of barrier layer above the slice of APT layer, a slice of bottom channel layer above the slice of barrier layer, and a slice of top channel layer above the slice of bottom channel layer. Each channel layer comprises a first sublayer of removable semiconductor material overlaid by a second sublayer of semiconductor material.

Figure 1A:
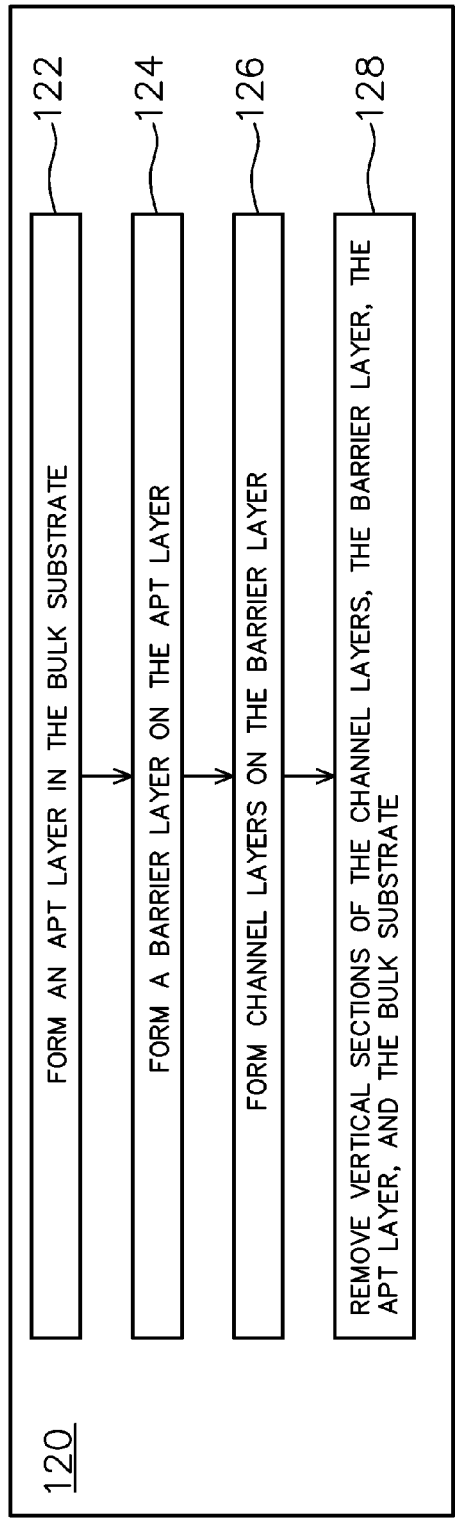
FIG. 1A is a process flow chart of an operation of FIG. 1 in accordance with some embodiments.

FIG. 1A is a process flow chart of operation 120 of FIG. 1. The fins are formed by first forming an APT layer in the bulk substrate (operation 122). The APT layer is formed in the bulk substrate by, for example, ion implantation operations. Next, a barrier layer is formed on the APT layer (operation 124). The barrier layer is formed on the APT layer by, for example, epitaxial growth operations. For example, the epitaxial growth operations include a gas phase deposition operation, such as a chemical vapor deposition (CVD) operation. Then, channel layers are formed in succession on the barrier layer (operation 126). Thereafter, vertical sections of the channel layers, the barrier layer, the APT layer, and the bulk substrate are removed (operation 128). The structure that remains is the bulk substrate with vertically extending fins. In this example, the channel layers are formed on the barrier layer by epitaxial growth operations, which include a CVD operation. Also, in this example, the bulk substrate is a silicon substrate, the first sublayer comprises SiGe, and the second sublayer comprises Si. Also, in this example, a hard mask is formed above the top channel layer.

It is noted that, since the APT layer is formed in the bulk substrate prior to the formation of the channel layers, at least one of the APT layer and the channel layers can be formed at a relatively high dose of a material. In an exemplary embodiment, the APT layer is formed of a material at a dose of about 1E18 atoms/cm$^2$ to about 1E19 atoms/cm$^2$. Also, in the exemplary embodiment, at least one of the first sublayers, SiGe, and the second sublayers, Si, of the channel layers is formed of a material at a dose of about 2E17 atoms/cm$^2$ to about 1E18 atoms/cm$^2$.

Figures 2, 3, 4:
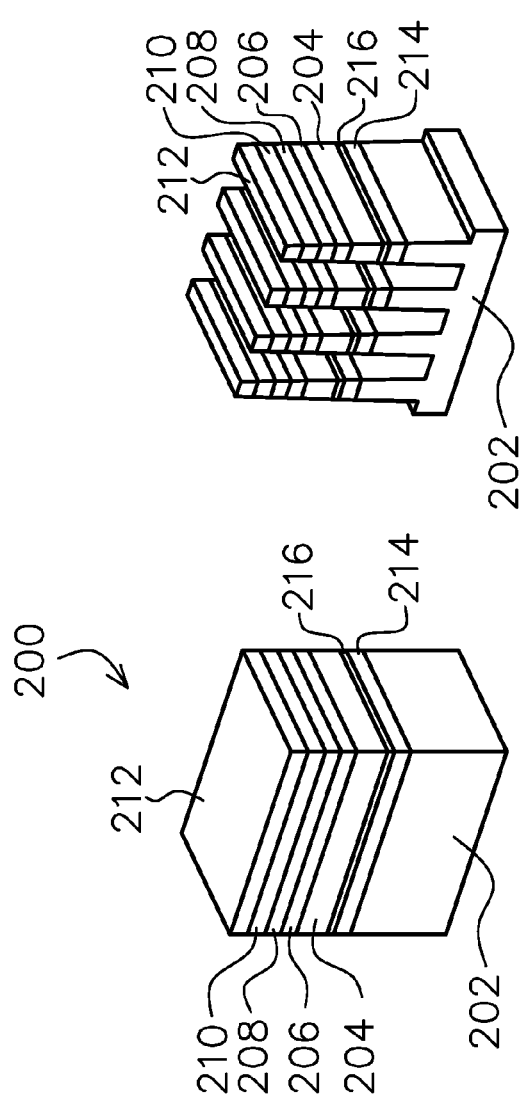
FIG. 2 is a block diagram of an example semiconductor structure at one stage during fabrication of a semiconductor device having a horizontal gate all around structure in accordance with some embodiments.
FIG. 3 is a block diagram of an example semiconductor structure at another stage during fabrication of a semiconductor device having a horizontal gate all around structure in accordance with some embodiments.
FIG. 4 is a block diagram of an example semiconductor structure at another stage during fabrication of a semiconductor device having a horizontal gate all around structure in accordance with some embodiments.

FIG. 2 is a block diagram of an example semiconductor structure at one stage during fabrication of a semiconductor device having a horizontal gate all around structure. This diagram illustrates an example semiconductor structure after an APT layer is formed in a bulk substrate (e.g., operation 122 of FIG. 1A), a barrier layer is formed on the APT layer (e.g., operation 124 of FIG. 1A), bottom and top channel layers are formed on the barrier layer (e.g., operation 126 of FIG. 1A). In this example, the thickness of the barrier layer is about 3 nm to about 10 nm. Shown is the example semiconductor structure 200 with a bulk substrate 202, an APT layer 214, a barrier layer 216, a first sublayer 204 of a bottom channel layer containing removable semiconductor material, a second sublayer 206 of the bottom channel layer containing semiconductor material, a first sublayer 208 of a top channel layer containing removable semiconductor material, a second sublayer 210 of the top channel layer containing semiconductor material, and a hard mask 212.

In an exemplary embodiment, the semiconductor structure 200 is an N-channel semiconductor structure, and the APT layer 214 includes Si and at least one of B, Bf$_2$, and In. In such an exemplary embodiment, the barrier layer 216 includes SiC. Also, in such an exemplary embodiment, the carbon content of the barrier layer 216 is about 0.3% to about 1%. In another exemplary embodiment, the semiconductor structure 200 is a P-channel semiconductor structure, and the APT layer 214 includes Si and at least one of P and As. In such another exemplary embodiment, the barrier layer 216 includes SiGeC. Also, in such another exemplary embodiment, the carbon content of the barrier layer 216 is about 0.3% to about 1% and the germanium content of the barrier layer 216 is about 10% to about 30%.

FIG. 3 is a block diagram of an example semiconductor structure at another stage during fabrication of a semiconductor device having a horizontal gate all around structure. This diagram illustrates an example semiconductor structure after fins are formed by removing vertical sections of the channel layers, the barrier layer, the APT layer, and the bulk substrate (e.g., operation 128 of FIG. 1A). Shown is an example semiconductor structure with four fins wherein each fin comprises a vertical slice of the bulk substrate 202, a slice of the APT layer 214 in the slice of the bulk substrate 202, a slice of the barrier layer 216 above the slice of the APT layer 214, the bottom channel layer above the barrier layer 216 comprising a slice of the first sublayer 204 and a slice of the second sublayer 206, the top channel layer above the bottom channel layer comprising a slice of the first sublayer 208 and a slice of the second sublayer 210, and a slice of the hard mask 212 above the slice of the second sublayer 210 of the top channel layer.

Referring back to FIG. 1, after fin formation, a shallow trench isolation (STI) material is provided between the plurality of fins (operation 130).

Figure 1B:
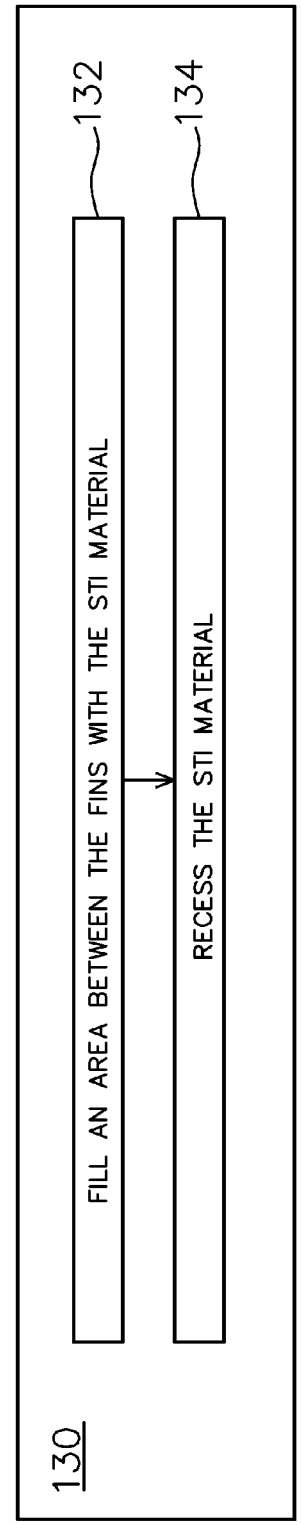
FIG. 1B is a process flow chart of another operation of FIG. 1 in accordance with some embodiments.

FIG. 1B is a process flow chart of operation 130 of FIG. 1. The provision of a STI material is accomplished by filling an area between the fins with the STI material (operation 132) and creating a recess in the STI material so that the STI material extends above the vertical slices of the barrier layer but below the vertical slices of the second sublayer of the bottom channel layer (operation 134). Filling an area between the fins with the STI material involves chemical mechanical polishing (CMP) operations to shape the STI material and removing the hard mask from above the top channel layer.

FIG. 4 is a block diagram of an example semiconductor structure at another stage during fabrication of a semiconductor device having a horizontal gate all around structure. This diagram illustrates an example semiconductor structure after filling the area between the fins with the STI material (e.g., operation 132 of FIG. 1B). Shown is the example semiconductor structure with the STI material 410.

Figure 5:
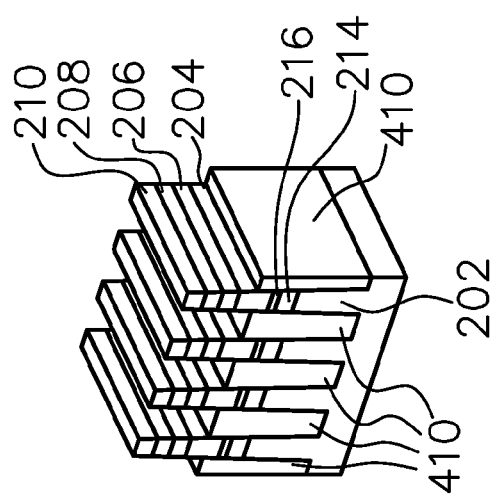
FIG. 5 is a block diagram of an example semiconductor structure at another stage during fabrication of a semiconductor device having a horizontal gate all around structure in accordance with some embodiments.

FIG. 5 is a block diagram of an example semiconductor structure at another stage during fabrication of a semiconductor device having a horizontal gate all around structure. This diagram illustrates an example semiconductor structure after recessing the STI material (e.g., operation 134 of FIG. 1B). Shown is the example semiconductor structure with the STI material 410 recessed such that the STI material 410 extends above the vertical slices of the barrier layer 216 but below the vertical slices of the second sublayer 206 of the bottom channel layer.

Referring back to FIG. 1, after providing the STI material between the fins, a poly material is deposited around a central portion of the plurality of fins (operation 140). A hard mask is also formed over the poly material. A spacer material is also formed around the poly material.

Figure 6:
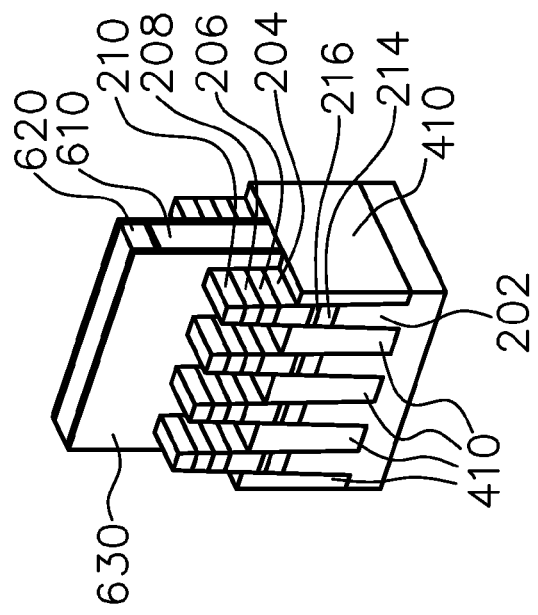
FIG. 6 is a block diagram of an example semiconductor structure at another stage during fabrication of a semiconductor device having a horizontal gate all around structure in accordance with some embodiments.

FIG. 6 is a block diagram of an example semiconductor structure at another stage during fabrication of a semiconductor device having a horizontal gate all around structure. This diagram illustrates an example semiconductor structure after a poly material is deposited around a central portion of the plurality of fins (e.g., operation 140 of FIG. 1). Shown is the example semiconductor structure with a poly material 610, a hard mask 620, and a spacer material 630.

Referring back to FIG. 1, formation of a plurality of pairs of source/drain (S/D) regions takes place (operation 150).

FIG. 1C is a process flow chart of operation 150 of FIG. 1. The formation of a plurality of pairs of S/D regions is accomplished by creating a recess in the plurality of fins to make space for the S/D regions (operation 152), forming an insulative boundary around each first sublayer in the central portion of the plurality of fins, and growing the S/D regions (operation 158), for example, using epitaxial growth operations. The S/D material comprises SiP for NFET and SiGeB for PFET.

Creating a recess in the plurality of fins to make space for the S/D regions involves removing from the plurality of fins the plurality of channel layers in regions of the plurality of fins not surrounded by the poly material.

Forming an insulative boundary around each first sublayer in the central portion of the plurality of fins involves removing side edges from each first sublayer by lateral etching operations (operation 154) and depositing an insulating material in an area vacated by removing the side edges (operation 156). Depositing an insulating material in an area vacated by removing the side edges also involves removing an excess insulating material by dry etching operations. The insulating material comprises SiN.

FIG. 7A is a block diagram of an example semiconductor structure at another stage during fabrication of a semiconductor device having a horizontal gate all around structure. This diagram illustrates an example semiconductor structure after S/D recess formation (e.g., operation 152 of FIG. 1C). FIG. 7B represents a cross sectional view of a portion of the semiconductor structure of FIG. 7A. These figures show recesses 710 formed where the channel layers of the fins previously existed.

FIG. 8A is a block diagram of an example semiconductor structure at another stage during fabrication of a semiconductor device having a horizontal gate all around structure. This diagram illustrates an example semiconductor structure after removing side edges from each first sublayer by lateral etching operations (e.g., operation 154 of FIG. 1C). FIG. 8B represents a cross sectional view of a portion of the semiconductor structure of FIG. 8A. These figures show recesses 810 where the side edges from the first sublayers previously existed.

Figure 9B:
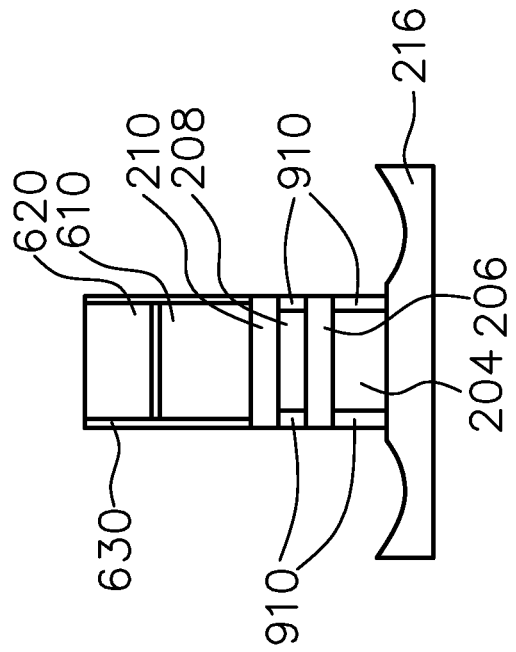
FIG. 9B represents a cross sectional view of a portion of the semiconductor structure of FIG. 9A in accordance with some embodiments.
Figure 9A:
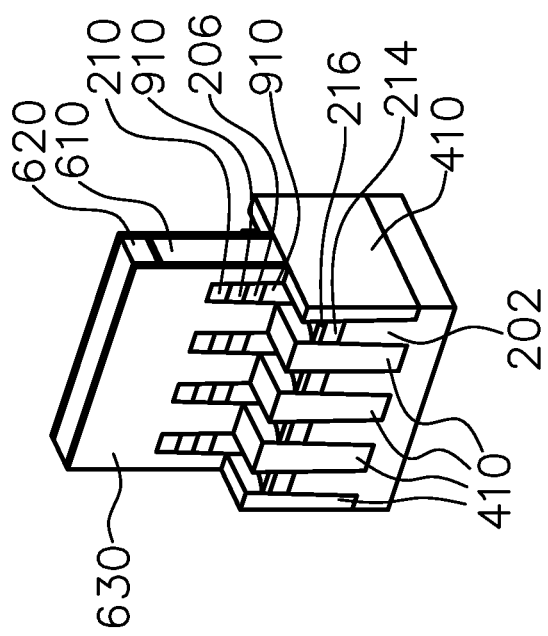
FIG. 9A is a block diagram of an example semiconductor structure at another stage during fabrication of a semiconductor device having a horizontal gate all around structure in accordance with some embodiments.

FIG. 9A is a block diagram of an example semiconductor structure at another stage during fabrication of a semiconductor device having a horizontal gate all around structure. This diagram illustrates an example semiconductor structure after depositing an insulating material in an area vacated by removing the side edges (e.g., operation 156 of FIG. 1C). FIG. 9B represents a cross sectional view of a portion of the semiconductor structure of FIG. 9A. These figures show an insulating material 910 at side edges.

Figure 10B:
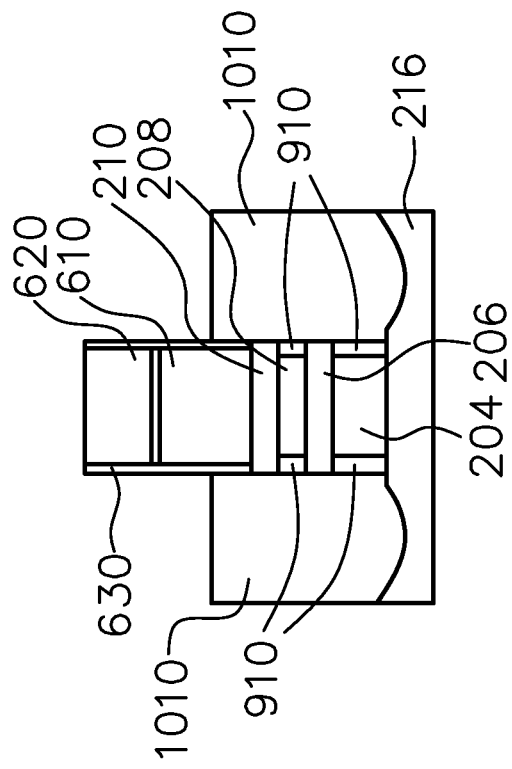
FIG. 10B represents a cross sectional view of a portion of the semiconductor structure of FIG. 10A in accordance with some embodiments.
Figure 10A:
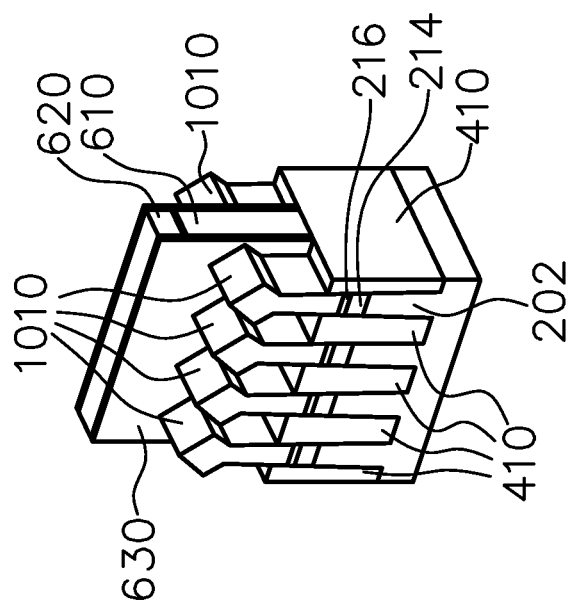
FIG. 10A is a block diagram of an example semiconductor structure at another stage during fabrication of a semiconductor device having a horizontal gate all around structure in accordance with some embodiments.

FIG. 10A is a block diagram of an example semiconductor structure at another stage during fabrication of a semiconductor device having a horizontal gate all around structure. This diagram illustrates an example semiconductor structure after S/D growth (e.g., operation 158 of FIG. 1C). FIG. 10B represents a cross sectional view of a portion of the semiconductor structure of FIG. 10A. These figures show S/D regions 1010. In an exemplary embodiment, the surface roughness of the S/D regions 1010 is about 0 nm to about 5 nm. It is noted that the APT layer 214 prevents punch through between the S/D regions 1010.

Referring back to FIG. 1, after S/D region formation, interlayer dielectric (ILD) layer formation takes place (operation 160), followed by poly material removal (operation 170). The ILD layer formation involves depositing an ILD material and shaping the ILD material using CMP operations.

FIG. 11A is a block diagram of an example semiconductor structure at another stage during fabrication of a semiconductor device having a horizontal gate all around structure. This diagram illustrates an example semiconductor structure after ILD layer formation (e.g., operation 160 of FIG. 1) and poly material removal (e.g., operation 170 of FIG. 1). FIG. 11B represents a cross sectional view of a portion of the semiconductor structure of FIG. 11A. These figures show an ILD layer 1110, and a void 1120 where the poly material previously existed.

Referring back to FIG. 1, nanowire formation (operation 180) takes place.

FIG. 1D is a process flow chart of operation 180 of FIG. 1. Nanowire formation involves removing first sublayer materials (operation 182), oxidizing a first sublayer material on the barrier layer and oxidizing second sublayer materials (operation 184), and removing oxidized materials to form a plurality of horizontal nanowires from the second sublayers (operation 186).

FIG. 12A is a block diagram of an example semiconductor structure at another stage during fabrication of a semiconductor device having a horizontal gate all around structure. This diagram illustrates an example semiconductor structure after removing first sublayer materials (e.g., operation 182 of FIG. 1D). In this example, SiGe is removed. FIG. 12B represents a cross sectional view of a portion of the semiconductor structure of FIG. 12A. These figures show voids 1210 where the first sublayer materials previously existed.

Figure 13A:
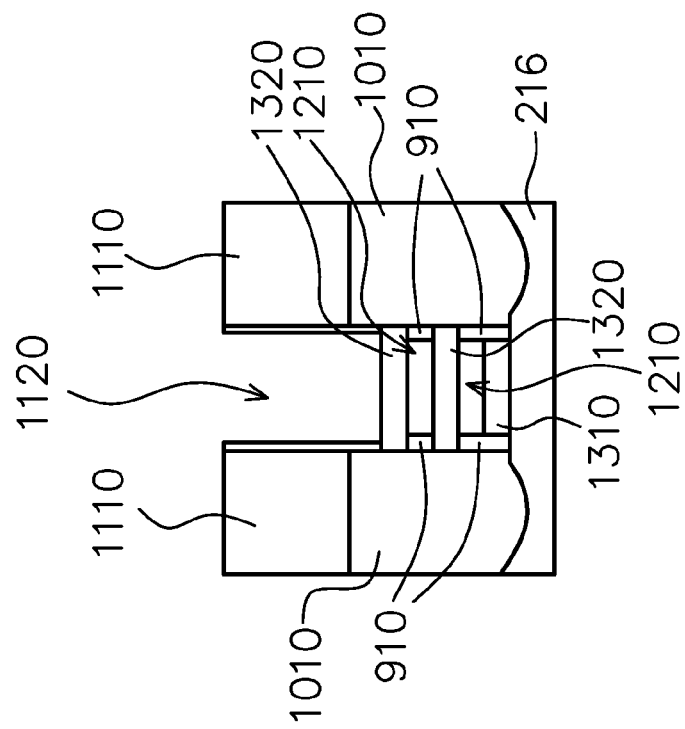
FIG. 13A is a block diagram of an example semiconductor structure at another stage during fabrication of a semiconductor device having a horizontal gate all around structure in accordance with some embodiments.
Figure 13B:
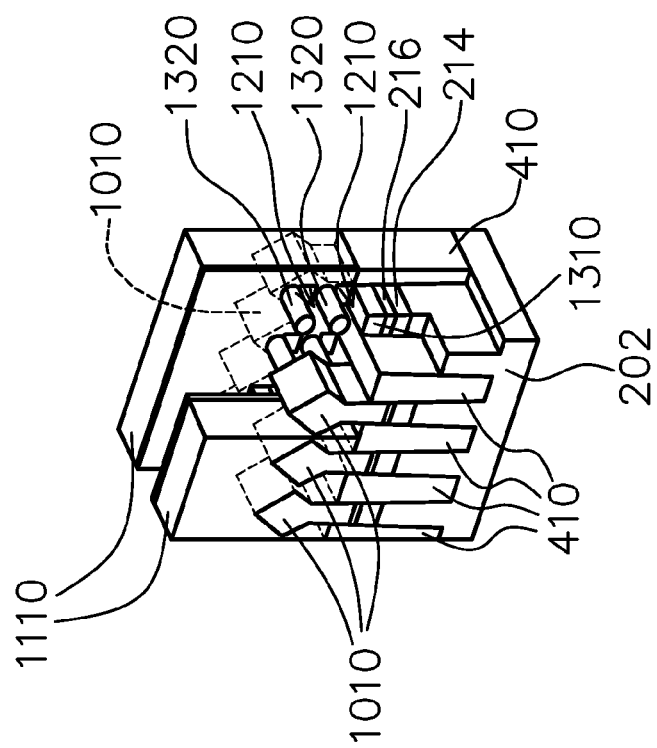
FIG. 13B represents a cross sectional view of a portion of the semiconductor structure of FIG. 13A in accordance with some embodiments.

FIG. 13A is a block diagram of an example semiconductor structure at another stage during fabrication of a semiconductor device having a horizontal gate all around structure. This diagram illustrates an example semiconductor structure after oxidation (e.g., operation 184 of FIG. 1D) and oxide removal (e.g., operation 186 of FIG. 1D). FIG. 13B represents a cross sectional view of a portion of the semiconductor structure of FIG. 13A. These figures show an oxidized first sublayer material 1310 between the void 1210 and the barrier layer 216, nanowires 1320 formed as a result of oxide removal, and the S/D regions 1010, each pair of which are interconnected by the nanowires 1320 of a corresponding one of the fins. It is noted that the barrier layer 216 minimizes back-diffusion of the APT layer 214 into the nanowires 1320.

Referring back to FIG. 1, metal gate formation (operation 190) takes place. Metal gate formation involves forming a gate around the nanowires, which includes depositing an interfacial layer dielectric with a high K value and depositing a metal gate material.

FIG. 14A is a block diagram of an example semiconductor structure at another stage during fabrication of a semiconductor device having a horizontal gate all around structure. This diagram illustrates an example semiconductor structure after metal gate formation (e.g., operation 190 of FIG. 1). FIG. 14B represents a cross sectional view of a portion of the semiconductor structure of FIG. 14A. FIG. 14C represents a cross sectional view of another portion of the semiconductor structure of FIG. 14A and in particular shows spacers 1410. Shown in these figures are a metal gate material 1420 formed around the nanowires 1320, the spacers 1410 for reducing the risk of bridging between the gate 1420 and the S/D regions 1010, and the oxide layer 1310 (e.g., SiGeOx) for substrate isolation and parasitic capacitance reduction. In this example, the diameter of the nanowires 1320 is 4-8 nm. The thickness of the bottom metal gate 1420 is 3-15 nm. The thickness of the oxide layer 1310 (e.g., SiGeOx) is 2-10 nm. The width of the internal spacer 1410 (e.g., SiN) is 2-10 nm.

Figure 15:
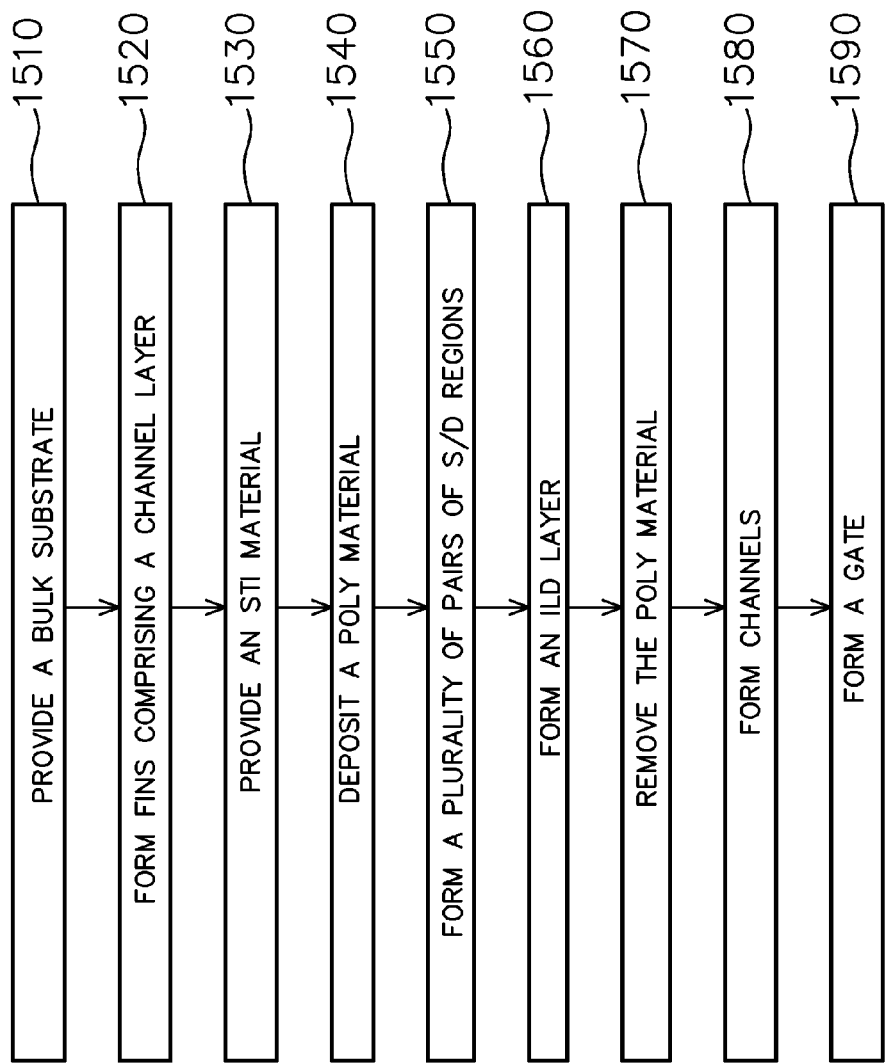
FIG. 15 is a process flow chart illustrating an example method of forming a semiconductor device having a horizontal gate all around structure in accordance with some embodiments.

FIG. 15 is a process flow chart illustrating an example method of forming a semiconductor device having a horizontal gate all around structure. In this example, the semiconductor device has a quad gate structure wherein instead of each fin comprising a plurality of horizontal extending nanowires, the fin comprises a wider channel structure.

The method begins with the provision of a bulk substrate (operation 1510). A plurality of fins are then formed on the bulk substrate (operation 1520). Each fin comprises a vertical slice of substrate material, a slice of APT layer in the vertical slice of substrate material, a slice of barrier layer above the slice of APT layer, and a slice of channel layer above the slice of barrier layer. The channel layer comprises a first sublayer of removable semiconductor material overlaid by a second sublayer of semiconductor material.

The fins are formed by first forming an APT layer in the bulk substrate. Next, a barrier layer is formed on the APT layer. Then, a channel layer is formed on the barrier layer. Thereafter, vertical sections of the channel layer, the barrier layer, the APT layer, and the bulk substrate are removed. The structure that remains is the bulk substrate with vertically extending fins. In this example, the bulk substrate is a silicon substrate, the first sublayer comprises SiGe, and the second sublayer comprises Si. Also, in this example, a hard mask is formed above the channel layer.

It is noted that, since the APT layer is formed in the bulk substrate prior to the formation of the channel layer, at least one of the APT layer and the channel layer can be formed at a relatively high dose of a material. In an exemplary embodiment, the APT layer is formed of a material at a dose of about 1E18 atoms/cm$^2$ to about 1E19 atoms/cm$^2$. Also, in the exemplary embodiment, at least one of the first sublayer, SiGe, and the second sublayer, Si, of the channel layer is formed of a material at a dose of about 2E17 atoms/cm$^2$ to about 1E18 atoms/cm$^2$.

After fin formation, an STI material is provided between the plurality of fins (operation 1530).

Next, a poly material is deposited around a central portion of the plurality of fins (operation 1540). A hard mask is also formed over the poly material. A spacer material is also formed around the poly material.

Next, formation of a plurality of pairs of S/D regions takes place (operation 1550). This is accomplished by creating a recess in the plurality of fins to make space for the S/D regions, forming an insulative boundary around the first sublayer in the central portion of the plurality of fins, followed by growing the S/D regions, for example, using epitaxial growth operations. The S/D material comprises SiP for NFET and SiGeB for PFET.

After S/D region formation, an ILD layer formation takes place (operation 1560). The ILD layer formation involves depositing an ILD material and shaping the ILD material using CMP operations.

Next, poly material removal (operation 1570) takes place. Channel formation (operation 1580) follows poly material removal. Channel formation involves removing a first sublayer material, oxidizing a first sublayer material on the barrier layer, oxidizing a second sublayer material, and removing an oxidized material to form a plurality of horizontal channels from the second sublayer.

Metal gate formation (operation 1590) follows channel formation. Metal gate formation involves forming a gate around the channels, which includes depositing an interfacial layer dielectric with a high K value and depositing a metal gate material.

Figure 16:
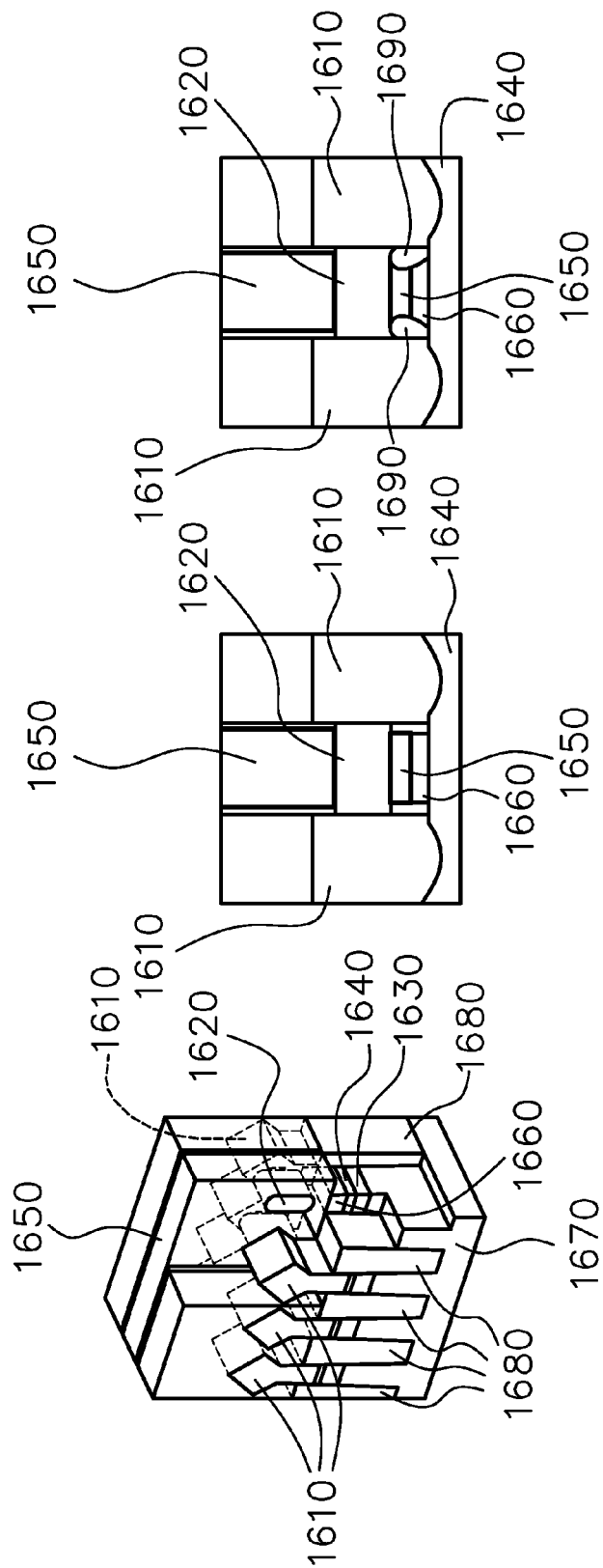
FIG. 16A is a block diagram of an example semiconductor structure at one stage during fabrication of a semiconductor device having a horizontal gate all around structure in accordance with some embodiments.
FIG. 16B represents a cross sectional view of a portion of the semiconductor structure of FIG. 16A in accordance with some embodiments.
FIG. 16C represents a cross sectional view of another portion of the semiconductor structure of FIG. 16A in accordance with some embodiments.

FIG. 16A is a block diagram of an example semiconductor structure after metal gate formation (e.g., operation 1590 of FIG. 15). FIG. 16B represents a cross sectional view of a portion of the semiconductor structure of FIG. 16A. FIG. 16C represents a cross sectional view of another portion of the semiconductor structure of FIG. 16A and in particular shows spacers 1690. In this example, the horizontal channels have a greater surface area than the nanowires of the example semiconductor structure formed via the method of FIG. 1. The height of the channels is 10-30 nm. The thickness of the bottom metal gate is 3-15 nm. The thickness of the oxide layer (e.g., SiGeOx) is 2-10 nm. The width of the internal spacers is 2-10 nm. The surface roughness of the S/D regions is about 0 nm to about 5 nm. The thickness of the barrier layer is about 3 nm to about 10 nm.

Shown in the figures are an APT layer 1630 for preventing punch through between S/D regions 1610, a barrier layer 1640 for minimizing back-diffusion of the APT layer 1630 into channels 1620, a metal gate 1650 formed around the channels 1620, the spacers 1690 for reducing the risk of bridging between the gate 1650 and the S/D regions 1610, an oxide layer 1660 (e.g., SiGeOx) for substrate isolation and parasitic capacitance reduction, a bulk substrate 1670, and an STI material 1680.

In an exemplary embodiment, the semiconductor structure is an N-channel semiconductor structure, and the APT layer 1630 includes Si and at least one of B, Bf$_2$, and In. In such an exemplary embodiment, the barrier layer 1640 includes SiC. Also, in such an exemplary embodiment, the carbon content of the barrier layer 1640 is about 0.3% to about 1%. In another exemplary embodiment, the semiconductor structure is a P-channel semiconductor structure, and the APT layer 1630 includes Si and at least one of P and As. In such another exemplary embodiment, the barrier layer 1640 includes SiGeC. Also, in such another exemplary embodiment, the carbon content of the barrier layer 1640 is about 0.3% to about 1% and the germanium content of the barrier layer 1640 is about 10% to about 30%.

Figure 17:
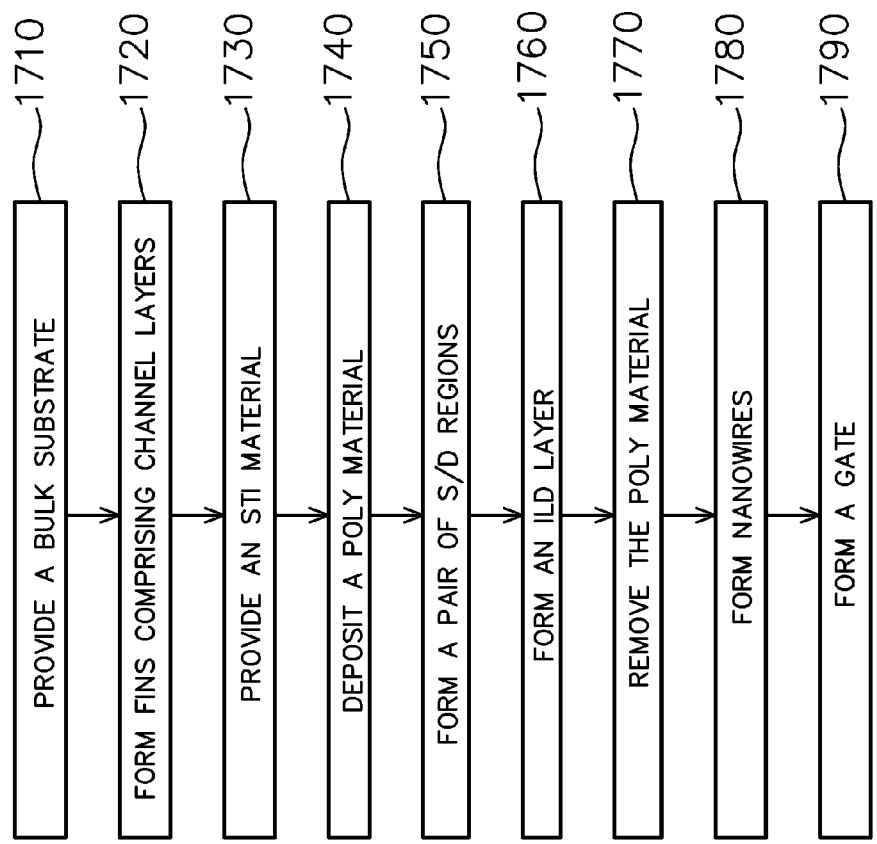
FIG. 17 is a process flow chart illustrating an example method of forming a semiconductor device having a horizontal gate all around structure in accordance with some embodiments.

FIG. 17 is a process flow chart illustrating an example method of forming a semiconductor device having a horizontal gate all around structure. In this example, the semiconductor device has a crown structure wherein instead of the semiconductor device comprising a plurality of pairs of S/D regions, the semiconductor device comprises a pair of S/D regions.

The method begins with the provision of a bulk substrate (operation 1710). A plurality of fins are then formed on the bulk substrate (operation 1720). Each fin comprises a vertical slice of substrate material, a slice of APT layer in the vertical slice of substrate material, a slice of barrier layer above the slice of APT layer, a slice of bottom channel layer above the slice of barrier layer, and a slice of top channel layer above the slice of bottom channel layer. Each channel layer comprises a first sublayer of removable semiconductor material overlaid by a second sublayer of semiconductor material.

The fins are formed by first forming an APT layer in the bulk substrate. Next, a barrier layer is formed on the APT layer. Then, bottom and top channel layers are formed in succession on the barrier layer. Thereafter, vertical sections of the channel layers, the barrier layer, the APT layer, and the bulk substrate are removed. The structure that remains is the bulk substrate with vertically extending fins. In this example, the bulk substrate is a silicon substrate, the first sublayer comprises SiGe, and the second sublayer comprises Si. Also, in this example, a hard mask is formed above the top channel layer.

It is noted that, since the APT layer is formed in the bulk substrate prior to the formation of the channel layers, at least one of the APT layer and the channel layers can be formed at a relatively high dose of a material. In an exemplary embodiment, the APT layer is formed of a material at a dose of about 1E18 atoms/cm$^2$ to about 1E19 atoms/cm$^2$. Also, in the exemplary embodiment, at least one of the first sublayers, SiGe, and the second sublayers, Si, of the channel layers is formed of a material at a dose of about 2E17 atoms/cm$^2$ to about 1E18 atoms/cm$^2$.

After fin formation, an STI material is provided between the plurality of fins (operation 1730).

Next, a poly material is deposited around a central portion of the plurality of fins (operation 1740). A hard mask is also formed over the poly material. A spacer material is also formed around the poly material.

Next, formation of a pair of S/D regions takes place (operation 1750). This is accomplished by creating a recess in the plurality of fins and the STI material to make space for the S/D regions, forming an insulative boundary around each first sublayer in the central portion of the plurality of fins, followed by growing the S/D regions, for example, using epitaxial growth operations. The S/D material comprises SiP for NFET and SiGeB for PFET.

After S/D region formation, an ILD layer formation takes place (operation 1760). The ILD layer formation involves depositing an ILD material and shaping the ILD material using CMP operations.

Next, poly material removal (operation 1770) takes place. Nanowire formation (operation 1780) follows poly material removal. Nanowire formation involves removing first sublayer materials, oxidizing a first sublayer material on the barrier layer, oxidizing second sublayer materials, and removing oxidized materials to form a plurality of horizontal nanowires from the second sublayers.

Metal gate formation (operation 1790) follows nanowire formation. Metal gate formation involves forming a gate around the nanowires, which includes depositing an interfacial layer dielectric with a high K value and depositing a metal gate material.

FIG. 18A is a block diagram of an example semiconductor structure after metal gate formation (e.g., operation 1790 of FIG. 17). FIG. 18B represents a cross sectional view of a portion of the semiconductor structure of FIG. 18A. Shown in these figures are a pair of S/D regions 1810 interconnected by nanowires 1820, an APT layer 1830 for preventing punch through between the S/D regions 1810, a barrier layer 1840 for minimizing back-diffusion of the APT layer 1830 into the nanowires 1820, a metal gate material 1850 formed around the nanowires 1820, an oxide layer 1860 (e.g., SiGeOx) for substrate isolation and parasitic capacitance reduction, a bulk substrate 1870, and an STI material 1880. In this example, the diameter of the nanowires 1820 is 4-8 nm. The thickness of the bottom metal gate 1850 is 3-15 nm. The thickness of the oxide layer 1860 (e.g., SiGeOx) is 2-10 nm. The surface roughness of the S/D regions 1810 is about 0 nm to about 5 nm. The thickness of the barrier layer 1840 is about 3 nm to about 10 nm.

In an exemplary embodiment, the semiconductor structure is an N-channel semiconductor structure, and the APT layer 1830 includes Si and at least one of B, Bf$_2$, and In. In such an exemplary embodiment, the barrier layer 1840 includes SiC. Also, in such an exemplary embodiment, the carbon content of the barrier layer 1840 is about 0.3% to about 1%. In another exemplary embodiment, the semiconductor structure is a P-channel semiconductor device, and the APT layer 1830 includes Si and at least one of P and As. In such another exemplary, the barrier layer 1840 includes SiGeC. Also, in such another exemplary embodiment, the carbon content of the barrier layer 1840 is about 0.3% to about 1% and the germanium content of the barrier layer 1840 is about 10% to about 30%.

Described herein are semiconductor devices having a horizontal gate all around (GAA) structure and methods of fabrication thereof. In some examples, to reduce the gate to S/D bridge risk, an internal spacer is formed between the bottom metal gate and the S/D regions. In addition, the first sublayer material, SiGeOx, is formed for substrate isolation and parasitic capacitance reduction. Moreover, an APT layer is formed for preventing punch through between the S/D regions. Further, a barrier layer is formed for minimizing back-diffusion of the APT layer into the nanowires or the channels. A similar methodology may be used for fabricating a semiconductor device having a horizontal gate all around (GAA) structure with a quad-gate structure and a crown structure.

In an embodiment of a semiconductor device having a horizontal gate all around structure, the semiconductor device includes a substrate and a fin. The fin is disposed on the substrate, and includes an anti-punch through (APT) layer formed of a material at a dose of about 1E18 atoms/cm$^2$ to about 1E19 atoms/cm$^2$, and a barrier layer formed above the APT layer.

In another embodiment of a semiconductor device having a horizontal gate all around structure, the semiconductor device includes a substrate, a plurality of fins, and a pair of source and drain regions. Each of the fins is disposed on the substrate and includes a nanowire, an anti-punch through (APT) layer, and a barrier layer between the APT layer and the nanowire. The source and drain regions are interconnected by the nanowires of the fins.

In an embodiment of a method of forming a semiconductor device having a horizontal gate all around structure, the method includes providing a bulk substrate, and forming a fin on the bulk substrate. The forming a fin on the bulk substrate includes: forming a channel layer above the bulk substrate; prior to the forming a channel layer above the bulk substrate, forming an anti-punch through (APT) layer in the bulk substrate; forming a barrier layer between the APT layer and the channel layer; and removing vertical sections of the channel layer, the barrier layer, the APT layer, and the bulk substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device having a horizontal gate all around structure, the semiconductor device comprising:
   a fin that is disposed on a substrate and includes
      a source-facing side and a drain-facing side,
      an anti-punch-through (APT) layer above and physically contacting the substrate,
      a barrier layer above and physically contacting the APT layer, wherein the barrier has a different composition from the substrate,
      a metal gate above the barrier layer, and
      a nanowire above the metal gate;
   a source located alongside the fin's source-facing side and projecting upward from the barrier layer to a location above the nanowire, such that a portion of the barrier layer is sandwiched between the APT layer and the source; and
   a drain located alongside the fin's drain-facing side and projecting upward from the barrier layer to a location above the nanowire, such that the nanowire extends horizontally from physical contact with the source to physical contact with the drain.

2. The semiconductor device of claim 1, wherein the semiconductor device is an N-channel semiconductor device and the APT layer includes Si and at least one of B, BF$_2$, and In.

3. The semiconductor device of claim 1, wherein the semiconductor device is a P-channel semiconductor device and the APT layer includes Si and at least one of P and As.

4. The semiconductor device of claim 1, wherein the barrier layer includes SiC.

5. The semiconductor device of claim 1, wherein the barrier layer includes SiGeC.

6. The semiconductor device of claim 1, wherein the APT layer is formed of a material at a dose of about 1E18 atoms/cm$^2$ to about 1E19 atoms/cm$^2$.

7. The semiconductor device of claim 1, wherein the barrier layer includes SiC and the carbon content of the barrier layer is about 0.3% to about 1%.

8. The semiconductor device of claim 1, wherein barrier layer includes SiGeC and the germanium content of the barrier layer is about 10% to about 30%.

9. The semiconductor device of claim 1, wherein the barrier layer has a thickness of about 3 nanometers to about 10 nanometers.

10. The semiconductor device of claim 1, wherein the fin is a first fin, the source is a first source, the drain is a first drain, and the semiconductor device further includes:
    a second fin that includes:
       a source-facing side and a drain-facing side,
       an anti-punch-through (APT) layer above the substrate,
       a barrier layer above the APT layer,
       a metal gate above the barrier layer, and
       a nanowire above the metal gate;
    a second source located alongside the second fin's source-facing side and projecting upward from the second fin's barrier layer to a location above the second fin's nanowire;
    a second drain located alongside the second fin's drain-facing side and projecting upward from the second fin's barrier layer to a location above the second fin's nanowire;
    a source-side shallow trench isolation (STI) material formed between the first and second sources and projecting upward from the substrate; and
    a source-side interlayer dielectric (ILD) material formed between the first and second sources and projecting upward from a top of the source-side STI material to cover the tops of the first and second sources and two opposite sides of each of the first and second sources;
    a drain-side STI material formed between the first and second drains and projecting upward from the substrate; and
    a drain-side ILD material formed between the first and second drains and projecting upward from a top of the drain-side STI material to cover the tops of the first and second drains and two opposite sides of each of the first and second drains; and STI material formed between the first and second fins; wherein
  the first and second sources are spaced apart in a first direction,
  the first and second drains are spaced apart in the first direction, and
  the first source and the first drain are spaced apart in a second direction perpendicular to the first direction.

11. The semiconductor device of claim 10, further comprising:
  a metal gate material that is located (i) over both fins and (ii) over the STI material that is between the first and second fins and (iii) between the source-side ILD material and the drain-side ILD material.

12. A method of forming a semiconductor device having a horizontal gate all around structure, the method comprising:
  forming, over a substrate, a fin that includes a source-facing side and a drain-facing side, by
    forming, on the substrate, an anti-punch-through (APT) layer through ion implantation;
    epitaxially growing a barrier layer on the APT layer;
    forming, over the barrier layer, a channel layer,
    removing vertical sections of the channel layer, the barrier layer, the APT layer, and the substrate; and
  forming, alongside the fin's source-facing side, a source that projects upward from the barrier layer, such that a portion of the barrier layer is sandwiched between the APT layer and the source; and
  forming, alongside the fin's drain-facing side, a drain that projects upward from the barrier layer; and
  forming the channel layer into a metal gate above the barrier layer and a nanowire above the metal gate, such that the nanowire extends horizontally from physical contact with the source to physical contact with the drain.

13. The method of claim 12, wherein the APT layer is formed of a material at a dose of about 1E18 atoms/cm$^2$ to about 1E19 atoms/cm$^2$.

14. The method of claim 12, wherein the semiconductor device is an N-channel semiconductor device and the APT layer includes Si and at least one of B, BF$_2$, and In.

15. The method of claim 12, wherein the semiconductor device is a P-channel semiconductor device and the APT layer includes Si and at least one of P and As.

16. The method of claim 12, wherein the barrier layer includes SiC and the carbon content of the barrier layer is about 0.3% to about 1%.

17. The method of claim 12, wherein barrier layer includes SiGeC and the germanium content of the barrier layer is about 10% to about 30%.

18. The method of claim 12, wherein the barrier layer has a thickness of about 3 nanometers to about 10 nanometers.

19. The method of claim 12, wherein the nanowires are formed as a result of oxide removal.

20. A semiconductor device comprising:
  a fin that is disposed on a substrate and includes
    a source-facing side and a drain-facing side,
    an anti-punch-through (APT) layer above the substrate,
    a barrier layer above the APT layer,
    a metal gate above the barrier layer, and
    a nanowire above the metal gate;
  a source located alongside the fin's source-facing side and projecting upward from the barrier layer to a location above the nanowire, such that a portion of the barrier layer is sandwiched between the APT layer and the source;
  a drain located alongside the fin's drain-facing side and projecting upward from the barrier layer to a location above the nanowire, such that the nanowire extends horizontally from physical contact with the source to physical contact with the drain; and
  a spacer between the source and the metal gate, wherein the spacer includes horizontally-opposite first and second side surfaces, in which the spacer's first side surface physically contacts the source, and the spacer's second side surface physically contacts the metal gate and is bowed outward such that a maximum width of the spacer is at a location that is between the top and bottom ends of the spacer.

* * * * *

UNITED STATES PATENT AND TRADEMARK OFFICE
CERTIFICATE OF CORRECTION

PATENT NO. : 10,115,788 B2  
APPLICATION NO. : 14/512963  
DATED : October 30, 2018  
INVENTOR(S) : Kuo-Cheng Ching and Guan-Lin Chen Page 1 of 1

It is certified that error appears in the above-identified patent and that said Letters Patent is hereby corrected as shown below:

On the Title Page

Item (60) Related U.S. Application Data add:
Continuation-in-part of application No. 14/317,069, filed Jun. 27, 2014, now Pat. No. 9,881,993.

Signed and Sealed this
Twenty-fifth Day of December, 2018

Andrei Iancu
*Director of the United States Patent and Trademark Office*